United States Patent
Liu et al.

(10) Patent No.: US 9,674,952 B1
(45) Date of Patent: Jun. 6, 2017

(54) METHOD OF MAKING COPPER PILLAR WITH SOLDER CAP

(71) Applicant: Flextronics AP, LLC, Broomfield, CO (US)

(72) Inventors: Weifeng Liu, Dublin, CA (US); Anwar Mohammed, San Jose, CA (US); Zhen Feng, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 181 days.

(21) Appl. No.: 14/482,977

(22) Filed: Sep. 10, 2014

Related U.S. Application Data

(60) Provisional application No. 61/922,015, filed on Dec. 30, 2013.

(51) Int. Cl.
*H05K 1/09* (2006.01)
*H05K 1/11* (2006.01)
*H05K 3/40* (2006.01)

(52) U.S. Cl.
CPC ............. *H05K 1/092* (2013.01); *H05K 1/111* (2013.01); *H05K 3/4007* (2013.01); *H05K 2203/043* (2013.01); *H05K 2203/0736* (2013.01)

(58) Field of Classification Search
CPC .......... H05K 1/092; H05K 1/11; H05K 1/111; H05K 3/4007; H05K 2203/043; H05K 2203/0736

USPC ................ 174/257, 250, 255, 256, 258, 259
See application file for complete search history.

(56) References Cited

U.S. PATENT DOCUMENTS

| | | | |
|---|---|---|---|
| 5,739,586 A | 4/1998 | Cannizzaro | |
| 6,477,054 B1 | 11/2002 | Hagerup | |
| 7,269,017 B2 | 9/2007 | Berlin | |
| 2002/0166684 A1* | 11/2002 | Hammond | H01L 21/4857 174/524 |
| 2008/0186682 A1 | 8/2008 | Sugimura | |
| 2009/0220738 A1 | 9/2009 | Oka | |
| 2012/0103678 A1* | 5/2012 | Inaba | H05K 3/244 174/263 |

* cited by examiner

*Primary Examiner* — Tremesha S Willis
(74) *Attorney, Agent, or Firm* — Haverstock & Owens LLP

(57) ABSTRACT

An electrical interconnect includes a copper pillar and solder cap. The copper pillar and solder cap are formed onto a contact pad or an under bump metallurgy (UBM). In some applications, the contact pad or UBM is part of an electronic component, such as a semiconductor chip. In other cases, the contact pad is part of laminated substrate, such as a printed circuit board (PCB), or a ceramic substrate. The copper pillar and the solder cap are printed using an ink printer, such as an aerosol ink jet printer. A post heat treatment solidifies the interconnection between the contact pad or UBM, the copper pillar and the solder cap.

23 Claims, 4 Drawing Sheets

METHOD OF MAKING COPPER PILLAR WITH SOLDER CAP

RELATED APPLICATIONS

This Patent Application claims priority under 35 U.S.C. 119(e) of the U.S. provisional patent application, Application No. 61/922,015, filed on Dec. 30, 2013, and entitled "METHOD OF MAKING COPPER PILLAR WITH SOLDER CAP," which is also hereby incorporated by reference in its entirety.

FIELD OF THE INVENTION

The present invention is generally directed to device interconnects. More specifically, the present invention is directed to flip chip interconnect made of a copper pillar with solder cap.

BACKGROUND OF THE INVENTION

Electronic components, such as an integrated circuits, include contact pads that are attached to corresponding contact pads on an external circuit, such as a printed circuit board (PCB). Solder is commonly used to attach the integrated circuit to the PCB by depositing a solder bump to each contact pad on the integrated circuit. In order to mount the integrated circuit to the PCB, the integrated circuit is flipped over so that its contact pads are align with matching contact pads on the PCB, and then the solder is reflowed to complete the interconnect. As solder spreads when it is heated during reflow, the fine pitch capability, which is the distance between adjacent solder bumps is limited, such as in the range of about 110-120 um.

SUMMARY OF THE INVENTION

Embodiments are directed to an electrical interconnect the includes a copper pillar and solder cap. The copper pillar and solder cap are formed onto a contact pad or an under bump metallurgy (UBM). In some embodiments, the contact pad or UBM is part of an electronic component, such as a semiconductor chip. In other embodiments, the contact pad is part of laminated substrate, such as a printed circuit board (PCB), or a ceramic substrate. The copper pillar and the solder cap are printed using a ink printer, such as an aerosol ink jet printer. A post heat treatment solidifies the interconnection between the contact pad or UBM, the copper pillar and the solder cap.

In an aspect, a method of fabricating an interconnect is disclosed, The method includes configuring a substrate to have one or more contact pads and an under bump metallurgy layer coupled to each of the one or more contact pads. The method also includes printing copper ink onto the under bump metallurgy layer of each contact pad to form a copper pillar on the under bump metallurgy layer of each contact pad. The method also includes printing solder ink onto the copper pillar of each contact pad to form a solder layer on the copper layer of each contact pad. The method also includes performing a post heat treatment to reflow the solder layer into a solder bump and to form a solid connection between the solder bump, the copper pillar and the under bump metallurgy of each contact pad. In some embodiments, the substrate is an integrated circuit. In some embodiments, the substrate is a laminated substrate. In some embodiments, the substrate is a ceramic substrate. In some embodiments, the contact pad includes aluminum. In some embodiments, the under bump metallurgy layer includes titanium/copper, titanium/nickel/gold or titanium/nickel/copper. In some embodiments, the under bump metallurgy layer is plated to each contact pad. In some embodiments, the substrate is further configured to have a passivation layer coupled to the one or more contact pads. In some embodiments, the copper ink includes copper nano-particles. In some embodiments, the solder ink includes pure tin, tin/gold alloy or tin/gold/copper alloy. In some embodiments, printing copper ink onto the under bump metallurgy layer includes spraying the copper ink as an aerosol mist. In some embodiments, printing solder ink onto the copper pillar includes spraying the solder ink as an aerosol mist.

In another aspect, another method of fabricating an interconnect is disclosed. The method includes configuring a substrate to have one or more contact pads, and printing copper ink onto each of the one or more contact pads to form a copper pillar on each contact pad. The method also includes printing solder ink onto the copper pillar of each contact pad to form a solder layer on the copper layer of each contact pad. The method also includes performing a post heat treatment to reflow the solder layer into a solder bump and to form a solid connection between the solder bump, the copper pillar and the contact pad. In some embodiments, the substrate is an integrated circuit. In some embodiments, the substrate is a laminated substrate. In some embodiments, the substrate is a ceramic substrate. In some embodiments, the contact pad includes aluminum. In some embodiments, the contact pad also includes a plating over the aluminum, wherein the plating includes nickel/gold or pure copper. In some embodiments, the substrate is further configured to have a passivation layer coupled to the one or more contact pads. In some embodiments, the copper ink includes copper nano-particles. In some embodiments, the solder ink includes pure tin, tin/gold alloy or tin/gold/copper alloy. In some embodiments, printing copper ink onto the each contact pad includes spraying the copper ink as an aerosol mist. In some embodiments, printing solder ink onto the copper pillar includes spraying the solder ink as an aerosol mist.

In yet another aspect, an electronic assembly is disclosed. The electronic assembly includes a ceramic substrate, a copper pillar and a solder cap. The ceramic substrate includes one or more contact pads. The copper pillar is printed onto each of the one or more contact pads. The solder cap is printed onto the copper pillar on each of the one or more contact pads. In some embodiments, the contact pad includes aluminum. In some embodiments, the contact pad also includes a plating over the aluminum, wherein the plating includes nickel/gold or pure copper. In some embodiments, the electronic assembly also includes a passivation layer coupled to the one or more contact pads. In some embodiments, the solder cap includes pure tin, tin/gold alloy or tin/gold/copper alloy.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a component interconnect. Those of ordinary skill in the art will realize that the following detailed description of the component interconnect is illustrative only and is not intended to be in any way limiting. Other embodiments of the component interconnect will readily suggest themselves to such skilled persons having the benefit of this disclosure.

Reference will now be made in detail to implementations of the component interconnect as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
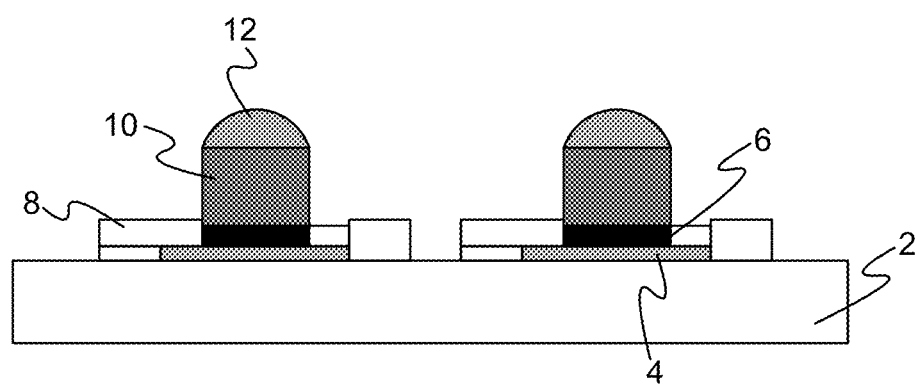
FIG. 1 illustrates an electronic assembly including a component interconnect according to an embodiment.

FIG. 1 illustrates an electronic assembly including a component interconnect according to an embodiment. The electronic assembly includes a substrate 2 having one or more contact pads 4. In some embodiments, the substrate 2 is an integrated circuit, such as a semiconductor chip. In other embodiments, the substrate 2 is a laminated substrate, such as a printed circuit board, or a ceramic substrate. A passivation layer 8 and an under bump metallurgy (UBM) layer 6 are formed on each contact pad 4. The contact pad 4, the UBM layer 6 and the passivation layer 8 are formed using well known fabrication techniques including, but not limited to, material deposition and photolithography. A copper pillar 10 is coupled to each UBM 6, and a solder cap 12 is coupled to each copper pillar 10. The copper pillar 10 and the solder cap 12 form a mechanical and electrical interconnect with the UBM 6.

Figure 2:
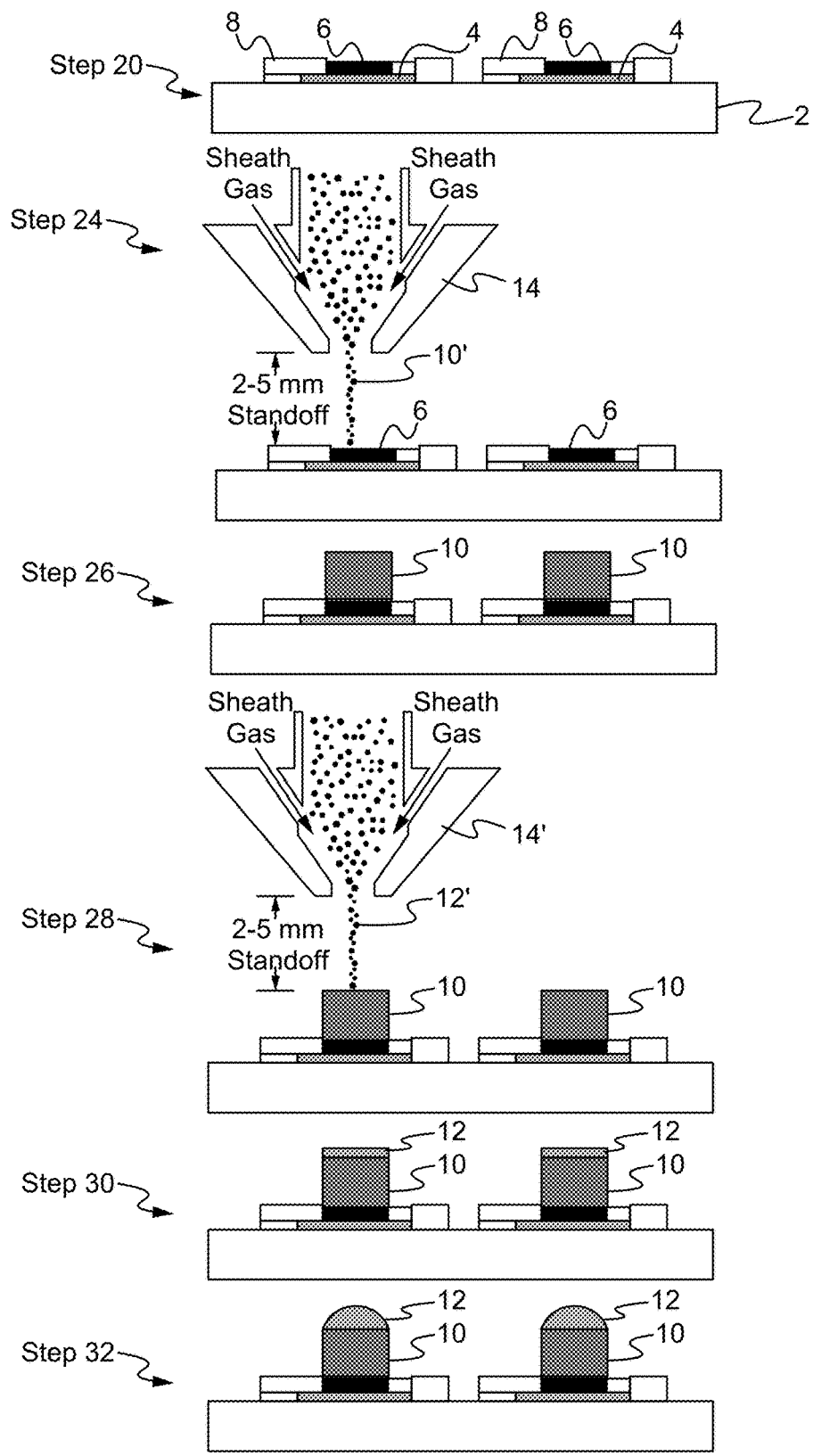
FIG. 2 illustrates a method of fabricating the electronic assembly of FIG. 1 according to an embodiment.

FIG. 2 illustrates a method of fabricating the electronic assembly of FIG. 1 according to an embodiment. At the step 20, the substrate 2 including one or more contact pads 4, UBM layer 6 and passivation layer 8 are fabricated. In this exemplary embodiment, the substrate 2 is an integrated circuit which is fabricated using well known semiconductor fabrication techniques. Alternatively, the substrate can be a laminated substrate, such as a printed circuit board, or a ceramic substrate. The contact pad 4, the UBM layer 6 and the passivation layer 8 are also formed using well known fabrication techniques including, but not limited to, material deposition and photolithography. In some embodiments, the one or more contact pads 4 are made of aluminum. Other types of metals or metal comminations can be used. In some embodiments, the UBM layer 6 is made of titanium/copper, titanium/nickel/gold or titanium/nickel/copper. In these embodiments, the UBM layer 6 is plated onto the contact pad 4. It is understood that other materials can be used for the UBM layer 6. Such alternative materials should adhere well, or otherwise couple well with, the material or materials used for the contact pad 4 and the copper of the copper pillar 10. In some embodiments, the UBM layer is plated to the contact pad 4. It is understood that alternative well known techniques can be used for applying the UBM layer 6 to the contact pad 4.

At the step 22 (not shown in FIG. 2), a cleaning treatment is performed on at least the exposed surface of the UBM layer 6. In some embodiments, plasma cleaning is performed.

At the step 24, a copper ink 10' is printed onto the UBM layer 6. The copper ink 10' is applied using an ink printer 14. In some embodiments, the ink printer 14 is an aerosol ink jet printer that sprays the copper ink 10' as an aerosol mist. In some embodiments, the copper ink 10' includes copper nano-particles. The copper ink 10' is applied layer by layer to form the copper pillar 10, which is shown at the step 26. The height of the copper pillar 10 is application specific and is achieved by forming more or less layers of copper ink as required.

At the step 28, a solder ink 12' is printed onto the copper pillar 10. The solder ink 12' is applied using an ink printer 14', which can be same or different than the ink printer 14 used to print the copper pillar 10. In some embodiments, the ink printer 14' is an aerosol ink jet printer that sprays the solder ink 12' as an aerosol mist. A solder material in the solder ink can be pure tin, a tin/gold alloy or a tin/gold/copper alloy. It is understood that other solder material can be used. The solder ink 12' is applied layer by layer to form the solder layer 12, which is shown at the step 30. The height of the solder layer 12 is application specific and is achieved by forming more or less layers of solder ink as required. In some embodiments, a combined height of the copper pillar 10 and solder layer 12 is in the range of about 40-50 um.

At the step 32, a post heat treatment is performed. As a result of the heat treatment, the solder of the solder layer 12 reflows to form a solder bump, referred to herein as the solder cap. The heat also treats the copper pillar 10 and the solder layer 12 to form a solid connection between the contact pad 4, the UBM 6, the copper pillar 10 and the solder layer 12.

Figure 3:
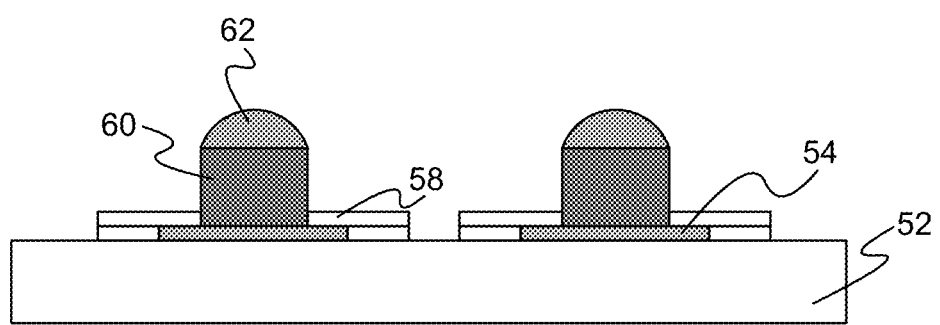
FIG. 3 illustrates an electronic assembly including a component interconnect according to another embodiment.

In some applications, a UBM layer is not formed on the contact pad. This is particularly applicable when the substrate is a laminated substrate, such as a printed circuit board, or a ceramic substrate. FIG. 3 illustrates an electronic assembly including a component interconnect according to another embodiment. The electronic assembly includes a substrate 52 having one or more contact pads 54. In some embodiments, the substrate 52 is a laminated substrate, such as a printed circuit board, or a ceramic substrate. In other embodiments, the substrate 52 is an integrated circuit, such as a semiconductor chip. A passivation layer 58 is formed on each contact pad 54 leaving a portion of the contact pad exposed. The contact pad 44 and the passivation layer 58 are formed using well known fabrication techniques including, but not limited to, material deposition and photolithography. A copper pillar 60 is coupled to each contact pad 54, and a solder cap 62 is coupled to each copper pillar 60. The copper pillar 60 and the solder cap 62 form a mechanical and electrical interconnect with the contact pad 54.

Figure 4:
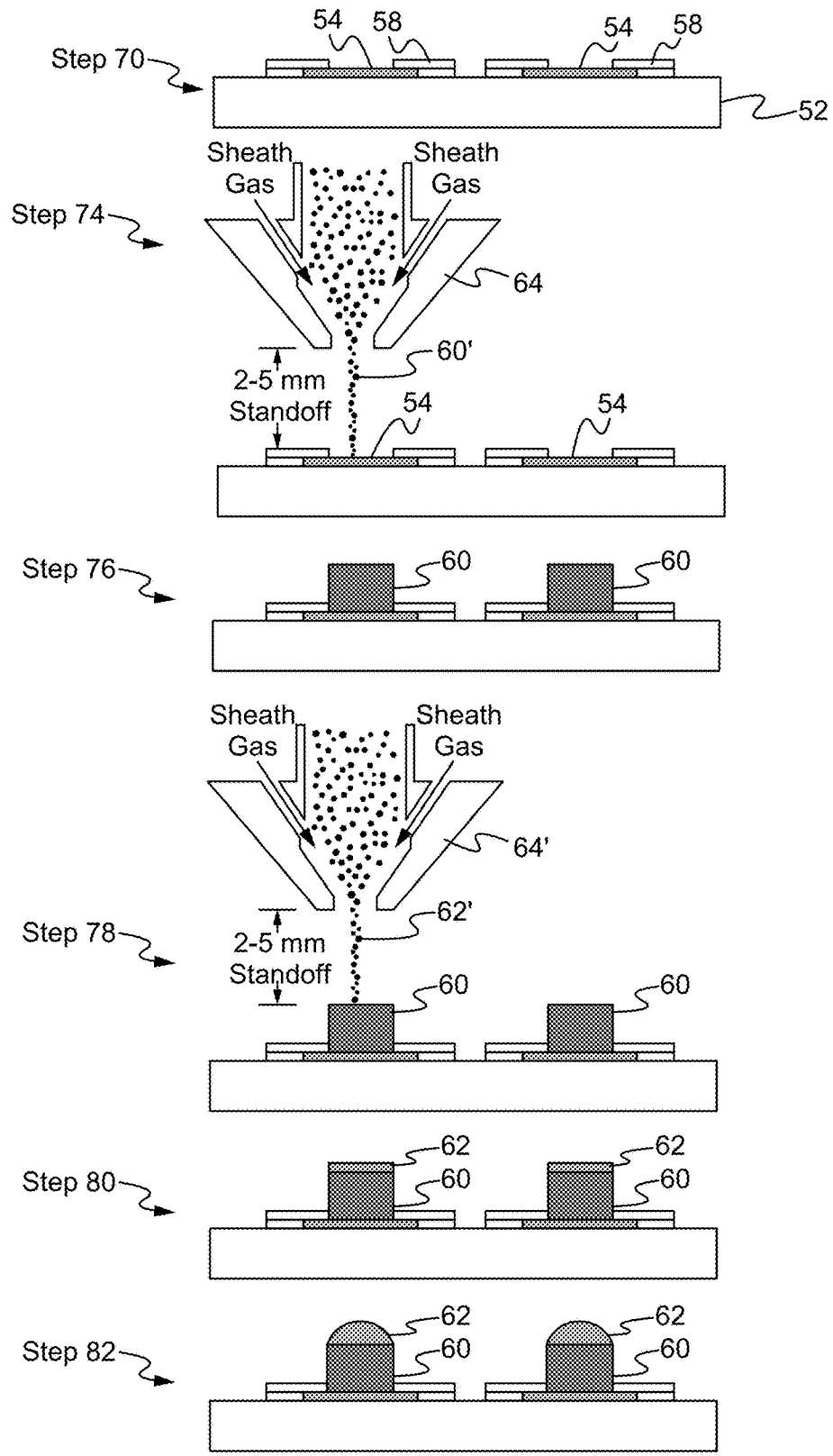
FIG. 4 illustrates a method of fabricating the electronic assembly of FIG. 3 according to an embodiment.

FIG. 4 illustrates a method of fabricating the electronic assembly of FIG. 3 according to an embodiment. At the step 70, the substrate 52 including one or more contact pads 54 and passivation layer 58 are fabricated. In this exemplary embodiment, the substrate 52 is laminated substrate, such as a printed circuit board, or a ceramic substrate. Alternatively, the substrate 52 can be a an integrated circuit which is fabricated using well known semiconductor fabrication techniques. The contact pad 54 and the passivation layer 8 are also formed using well known fabrication techniques including, but not limited to, material deposition and photolithography. In some embodiments, the one or more contact pads 54 are made of aluminum. Other types of metals or metal comminations can be used. In some embodiments, the contact pad 54 is plated. The plating material can be, but is not limited to, nickel/gold or pure copper. It is understood that other plating materials can be used. Such alternative plating materials should adhere well, or otherwise couple well with, the material or materials used for the contact pad 54 and the copper of the copper pillar 60.

At the step 72 (not shown in FIG. 4), a cleaning treatment is performed on at least the exposed surface of the contact pad 54. In some embodiments, plasma cleaning is performed.

At the step 74, a copper ink 60' is printed onto the contact layer 54. The copper ink 60' is applied using an ink printer 64. In some embodiments, the ink printer 64 is an aerosol ink jet printer that sprays the copper ink 60' as an aerosol mist. In some embodiments, the copper ink 60' includes copper nano-particles. The copper ink 60' is applied layer by layer to form the copper pillar 60, which is shown at the step 76. The height of the copper pillar 60 is application specific and is achieved by forming more or less layers of copper ink as required.

At the step 78, a solder ink 62' is printed onto the copper pillar 60. The solder ink 62' is applied using an ink printer 64', which can be same or different than the ink printer 64 used to print the copper pillar 60. In some embodiments, the ink printer 64' is an aerosol ink jet printer that sprays the solder ink 62' as an aerosol mist. A solder material in the solder ink can be pure tin, a tin/gold alloy or a tin/gold/copper alloy. It is understood that other solder material can be used. The solder ink 62' is applied layer by layer to form the solder layer 62, which is shown at the step 80. The height of the solder layer 62 is application specific and is achieved by forming more or less layers of solder ink as required. In some embodiments, a combined height of the copper pillar 60 and solder layer 62 is in the range of about 40-50 um.

At the step 82, a post heat treatment is performed. As a result of the heat treatment, the solder of the solder layer 62 reflows to form a solder bump, referred to herein as the solder cap. The heat also treats the copper pillar 60 and the solder layer 62 to form a solid connection between contact pad 54, the copper pillar 60 and the solder layer 62.

The copper pillar and solder cap interconnect provides a number of advantages including, but not limited to, a smaller fine pitch capability, increased interconnect density, improved electrical performance, low force and reduced damage on the substrate, better electro-migration resistance and better interconnect reliability. The methods of fabricating the copper pillar and solder cap interconnect is simpler and requires fewer steps than conventional interconnect fabrication techniques, and utilizes less expensive equipment. The methods also enable fast, easy adjustment of the shape and dimensions of the interconnects. The methods can also make copper pillar and solder cap interconnects on a variety of different substrates including, but not limited to, integrated circuits, laminated substrates such as printed circuit boards, and ceramic substrates. The methods are also suitable for high volume productions as well as prototyping.

The present application has been described in terms of specific embodiments incorporating details to facilitate the understanding of the principles of construction and operation of the component interconnect. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method of fabricating an interconnect, the method comprising:
   a. configuring a substrate to have one or more contact pads and an under bump metallurgy layer coupled to each of the one or more contact pads;
   b. printing copper ink onto the under bump metallurgy layer of each contact pad to form a copper pillar on the under bump metallurgy layer of each contact pad;
   c. printing solder ink onto the copper pillar of each contact pad to form a solder layer on the copper pillar of each contact pad; and
   d. performing a post heat treatment to reflow the solder layer into a solder bump and to form a solid connection between the solder bump, the copper pillar and the under bump metallurgy layer of each contact pad.

2. The method of claim 1 wherein the substrate comprises an integrated circuit.

3. The method of claim 1 wherein the substrate comprises a laminated substrate.

4. The method of claim 1 wherein the substrate comprises a ceramic substrate.

5. The method of claim 1 wherein each contact pad comprises aluminum.

6. The method of claim 1 wherein the under bump metallurgy layer comprises titanium/copper, titanium/nickel/gold or titanium/nickel/copper.

7. The method of claim 1 wherein the under bump metallurgy layer is plated to each contact pad.

8. The method of claim 1 wherein the substrate is further configured to have a passivation layer covering a first portion of each contact pad leaving a second portion of each contact pad exposed, wherein the copper pillar on each contact pad protrudes beyond an outer surface of the passivation layer such that at least a portion of copper pillar side surfaces are exposed.

9. The method of claim 1 wherein the copper ink comprises copper nano-particles.

10. The method of claim 1 wherein the solder ink comprises pure tin, tin/gold alloy or tin/gold/copper alloy.

11. The method of claim 1 wherein printing copper ink onto the under bump metallurgy layer comprises spraying the copper ink as an aerosol mist.

12. The method of claim 1 wherein printing solder ink onto the copper pillar comprises spraying the solder ink as an aerosol mist.

13. A method of fabricating an interconnect, the method comprising:
   a. configuring a substrate to have one or more contact pads and a passivation layer covering a first portion of each contact pad leaving a second portion of each contact pad exposed;
   b. printing copper ink onto the exposed portion of each of the one or more contact pads to form a copper pillar on each contact pad, wherein the copper pillar on each contact pad protrudes beyond an outer surface of the passivation layer such that at least a portion of copper pillar side surfaces are exposed;

c. printing solder ink onto the copper pillar of each contact pad to form a solder layer on the copper pillar of each contact pad; and d. performing a post heat treatment to reflow the solder layer into a solder bump and to form a solid connection between the solder bump, the copper pillar and the contact pad.

14. The method of claim 13 wherein the substrate comprises an integrated circuit.

15. The method of claim 13 wherein the substrate comprises a laminated substrate.

16. The method of claim 13 wherein the substrate comprises a ceramic substrate.

17. The method of claim 13 wherein each contact pad comprises aluminum.

18. The method of claim 17 wherein the contact pad further comprises a plating over the aluminum, further wherein the plating comprises nickel/gold or pure copper.

19. The method of claim 13 wherein the copper ink comprises copper nano-particles.

20. The method of claim 13 wherein the solder ink comprises pure tin, tin/gold alloy or tin/gold/copper alloy.

21. The method of claim 13 wherein printing copper ink onto the each contact pad comprises spraying the copper ink as an aerosol mist.

22. The method of claim 13 wherein printing solder ink onto the copper pillar comprises spraying the solder ink as an aerosol mist.

23. The method of claim 1 wherein the substrate comprises a base substrate, the one or more contact pads on a surface of the base substrate, and the under bump metallurgy layer applied onto each of the one or more contact pads.

* * * * *